United States Patent [19]

Schuermeyer

[11] 4,375,677
[45] Mar. 1, 1983

[54] DYNAMIC RANDOM ACCESS MEMORY CELL USING FIELD EFFECT DEVICES

[76] Inventor: Fritz L. Schuermeyer, 1759 Southview Dr., Yellow Springs, Ohio 45387

[21] Appl. No.: 265,522

[22] Filed: May 20, 1981

[51] Int. Cl.³ .............................................. G11C 11/40
[52] U.S. Cl. .................................... 365/154; 307/279
[58] Field of Search ............... 365/154, 205; 307/279, 307/291

[56] References Cited

U.S. PATENT DOCUMENTS 3,849,673 11/1974 Koo ..................................... 365/205
4,003,035 1/1977 Hoffman et al. .................... 365/205

FOREIGN PATENT DOCUMENTS 1904787 11/1970 Fed. Rep. of Germany ...... 365/154
533991 10/1976 U.S.S.R. .............................. 365/154

Primary Examiner—Stuart N. Hecker
Attorney, Agent, or Firm—Donald J. Singer; Bernard E. Franz

[57] ABSTRACT

The memory cell uses GaAs MESFET depletion mode devices, with a pair of cross coupled active transistors, a pair of load transistors, and a pair of access transistors. The level shifting required for Schottky Barriers is provided by capacitors in the cross coupling. A pair of initiation transistors are connected between the load and active transistors.

2 Claims, 2 Drawing Figures

PRIOR ART

DYNAMIC RANDOM ACCESS MEMORY CELL USING FIELD EFFECT DEVICES

RIGHTS OF THE GOVERNMENT

The invention described herein may be manufactured and used by or for the Government of the United States for all governmental purposes without the payment of any royalty.

BACKGROUND OF THE INVENTION

This invention relates to a dynamic random access memory cell using field effect devices.

Volatile random access semiconductor memories have been built using bipolar and MOS silicon transistors. Static semiconductor memories use flip-flop or cross-coupled inverters composed of bipolar or MOS transistors for each memory cell resulting in a memory that will hold the information in the memory cell so long as power supply voltages are maintained. There are also known memory cells, referred to as dynamic memories, in which the information is held in the memory cell by a charge capacitor which may be in the form of a capacitor or an expanded gate, source or drain electrode of a field effect transistor.

One common form of memory cell using field effect transistors comprises a pair of load transistors having their drain connected to a direct current bias source, a pair of directly cross-coupled active transistors, and a pair of access transistors. The three transistors of each half of the cell have a common junction point. The access transistors have their gate electrodes connected together to a word line, and the other electrodes of the two transistors connected respectively to two complementary conductors of a data bit line. Examples are shown in U.S. Pat. No. 4,175,290 by Hanani, referring to U.S. Pat. No. 3,831,155 and to a conference article by F. Schuermeyer and C. Young. Another example is shown in U.S. Pat. No. 4,044,343 by Uchida.

At present, Schottky Barrier (or metal semiconductor) field effect transistor technology has been developed. GaAs devices are used to obtain high speed operation. This technology uses depletion mode devices. Consequently the use of this technology requires level shift circuits which consume surface area, power, and which contribute to the delay of the circuit. The conventional level shift circuits use diodes in conjunction with current sources. Two level shift circuits would be required for every random access memory (RAM) cell. No GaAs random access memory cell has been reported.

SUMMARY OF THE INVENTION

An object of the invention is to provide a satisfactory random access memory cell using Schottsky Barrier field effect transistor technology, without the problems associated with diode type level shifters.

A random access memory cell using Schottky Barrier field effect transistors, according to the invention, uses two capacitors as level shifters in the cross coupling circuit. A further feature relates to the addition of a pair of transistors for initiation.

An advantage of the new memory cell is that it requires less surface area. Furthermore, the performance is improved due to the decrease in surface area and due to the avoidance of using diode level shifters which require dc current.

DETAILED DESCRIPTION

Figure 1:
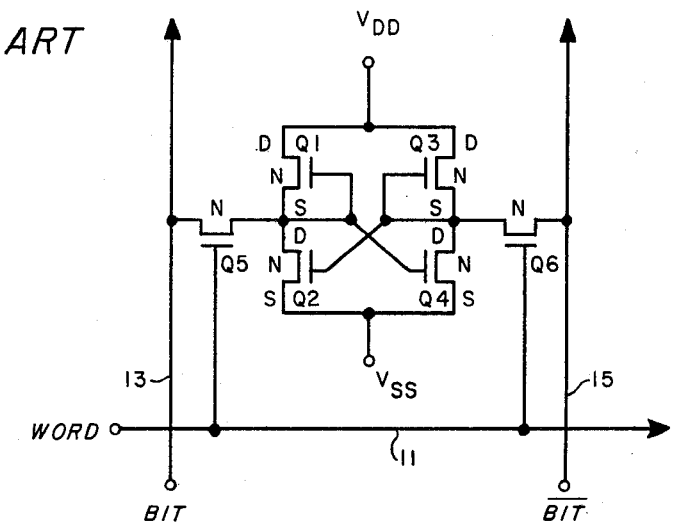
FIG. 1 is a schematic diagram of a prior art latch circuit used for volatile information storage.

FIG. 1 is a schematic diagram of a latch circuit used for volatile information storage, shown in U.S. Pat. No. 4,175,290, as prior art, from a referenced article by Schlageter et al. It comprises six IGFETS, Q1 through Q6, all of which are N-channel devices. Significantly, the load transistors Q1 and Q3 are depletion type N-channel transistors whereas the driver transistors Q2 and Q4 are enhancement type devices. The depletion load transistors Q1 and Q3 have their gates connected to their sources, rather than to the gates of their respective drivers. As a result they act as constant current sources to their respective driver transistors. Latching action is accomplished by cross-coupling the gate of the driver transistor of a given branch to the node at which the load and driver transistors of the other branch are joined. Consequently, application of a given information input signal on the lines 13 and 15 will result in turning on the driver transistor of the same branch when the word line 11 is activated to turn on the transistors Q5 and Q6.

Figure 2:
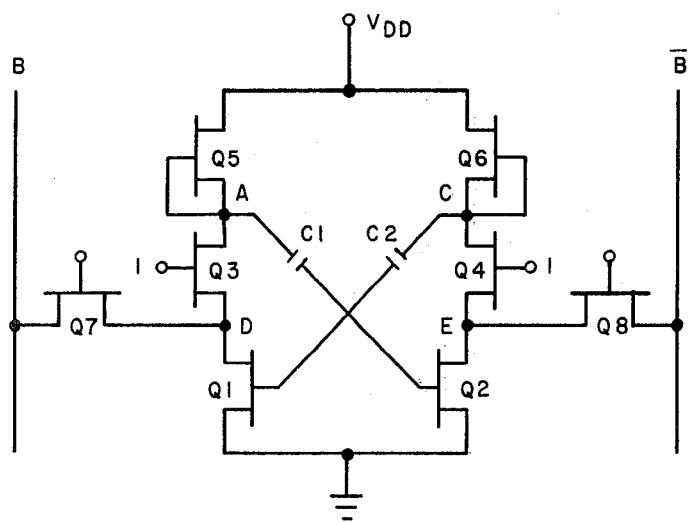
FIG. 2 is a schematic diagram of a memory cell according to the invention.

The preferred GaAs memory cell is shown in FIG. 2. All transistors are depletion mode MESFETs. All transistors and capacitors are formed as part of an integrated circuit. Transistors Q1 and Q2 are active transistors, Q3 and Q4 are required for initiation, Q5 and Q6 are load elements and Q7 and Q8 are needed for access to the bitlines B and B.

The cross-coupling circuit includes level shifting capacitors, which operate as described in my co-pending application Ser. No. 261,358 (AF 14012) filed May 7, 1981, hereby incorporated by reference.

The memory cell comprises the usual two branches of a bistable circuit with cross-coupling.

In one branch the active transistor Q1 is connected between ground (reference potential) and a node D, the initiation transistor Q3 is connected between node D and node A, the load transistor Q5 is connected between node A and the bias potential $V_{DD}$, and the access transistor Q7 is connected between node D and the bit line B. The load transistor Q5 also has its gate connected to node A. The four transistors Q2, Q4, Q6 and Q8 of the other branch are similarly connected to nodes E and C and to bit line B̄.

The cross-coupling circuit includes capacitor C1 connected between node A and the gate of transistor Q2, and capacitor C2 connected between node C and the gate of transistor Q1. Note for MESFET depletion mode devices wherein the gate represents a Schottky Barrier, that the output levels are high at a positive level approximately $V_{DD}$ and low at approximately zero volts, while at the transistor gates high is zero or slightly positive and low is at approximately negative three volts. In operation with signals which change at short intervals relative to the capacitive discharge time, the capacitors C1 and C2 have a voltage nearly equal to $V_{DD}$ and thus provide the required level shifting.

The operation of the cell can be divided into 3 distinct modes: Initiation, write and read.

Initiation mode: Access transistors Q7 and Q8 as well as initation transistors Q3 and Q4 are turned off by applying a low input voltage level ($\simeq -3$ V) to the gates of the transistors. This raises the potential at nodes A and C to $V_{DD}$. The gate voltages on transistors Q1 and Q2 remain approximately at 0 potential since these gates are Schottky Barrier diodes which become conducting with positive bias voltage. Consequently, a potential of approximately $V_{DD}$ appears across the capacitors C1 and C2. When the initiation transistors are returned to the on mode (high voltage$\simeq$0V at gates of transistors), the potential on nodes A and C decreases since transistors Q1, Q2, Q3 and Q4 are conducting. The gates on transistors Q1 and Q2 move towards negative voltage, turning transistors Q1 and Q2 off. This renders the cell to flip into a stable mode, where e.g. node A is at $V_{DD}$ potential and node C is at ground potential. This procedure initiates the cell and the cell can now be used for information storage using the write and read modes.

Write mode: After the RAM cell has been initiated, the initiation transistors Q3 and Q4 remain on. Now the cell can be written by applying a pattern to the bitlines B and $\overline{B}$, say $V_{DD}$ and 0 respectively. Now the access transistors Q7 and Q8 are turned on causing, for this example node C to remain or go to 0 voltage and node A to remain or go the $V_{DD}$. After the access transistors are turned off, the information remains stored in the cell. However, the charge on the gates leaks off and with time, the cell loses its information unless it is re-written with the inverted information within a time period, shorter than the discharge time.

Read mode: In the read mode, the bitlines B and $\overline{B}$, are precharged to the $V_{DD}$ level. When the access transistors are turned on one line goes to 0 potential while the other remains at $V_{DD}$ since one of the active transistors Q1 or Q2 is conducting and to ground and the other one is insulating. Say, using the above case, transistors Q2 is conducting and transistor Q1 is insulating; then line $\overline{B}$ is discharged to 0 potential and line B remains at $V_{DD}$. A sense amplifier, using known circuitry, senses the status of lines B and $\overline{B}$.

Known Technology is used in the preferred embodiment, as described by Rory K. Van Tuyl and Charles Liechti, High Speed GaAs MSI, Digest of Technical Papers, 1976 IEEE International Solid State Circuits Conference, paper WAM 1.5, page 20. Capacitors have been fabricated on integrated circuits and no new technology is needed. (E.g. See George Gibbons, Solid State Faces Now Questions, MSN (Microwave Systems News Journal, Vol. 9, No. 13)9 15-35, December 1979.)

Thus, while preferred constructional features of the invention are embodied in the structure illustrated herein, it is to be understood that changes and variations may be made by the skilled in the art without departing from the spirit and scope of my invention.

I claim:

1. A random access memory cell in which all transistors are depletion mode field effect transistors, each having a source, a gate and a drain, used with two complementary bit lines, said memory cell comprising:

first and second branches; with each branch comprising a load transistor having its source-drain path connected between a first node and a direct-current bias potential, an active transistor having its source-drain path connected between a reference potential and a second node, an initiation transistor having its source-drain path connected between the first and second nodes, and an access transistor having its source-drain path connected between the second node and one of the bit lines;

a cross-coupling means comprising two capacitors connected so that the first node of each branch is coupled via one of said capacitors to the gate of the active transistor of the other branch;

the memory cell having an initiation mode in which the initiation transistors are turned on and then turned off by signals at their gates to bring the first nodes both to near said bias potential so that the bias potential appears across both capacitors, following which the memory cell flips into a stable state with one active transistor conducting and the other nonconducting;

and write and read modes in which the access transistors are both turned on by address signals at their gates.

2. A memory cell according to claim 1, wherein all of said transistors are GaAs MESFET devices, and wherein all components including said capacitors are fabricated as part of an integrated circuit.

* * * * *